US006728513B1

(12) United States Patent
Nishina

(10) Patent No.: US 6,728,513 B1
(45) Date of Patent: Apr. 27, 2004

(54) RECEIVING APPARATUS SHARED BY MULTIPLE TUNERS

(75) Inventor: Motohisa Nishina, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 640 days.

(21) Appl. No.: 09/688,381

(22) Filed: Oct. 17, 2000

(30) Foreign Application Priority Data

Oct. 29, 1999 (JP) .......................................... 11-308748

(51) Int. Cl.⁷ ................................................. H04B 1/00
(52) U.S. Cl. ........................ 455/3.02; 455/255; 455/133
(58) Field of Search ............................... 455/3.02, 12.1, 455/3.01, 3.03, 3.04, 427, 428, 14, 20, 22, 179.1, 133, 13.1, 132, 134–138, 140, 3.05; 343/840, 746; 342/361, 362; 348/731, 205, 725; 725/68–71

(56) References Cited

U.S. PATENT DOCUMENTS

| 5,345,591 | A | * | 9/1994 | Tsurumaki et al. | ........... 725/69 |
| 6,009,304 | A | * | 12/1999 | Kato | .................. 725/68 |
| 6,011,597 | A | * | 1/2000 | Kubo | .................. 348/725 |
| 6,240,281 | B1 | * | 5/2001 | Le Roux et al. | ......... 455/193.1 |
| 6,334,045 | B1 | * | 12/2001 | Green et al. | ............... 455/3.02 |
| 6,397,038 | B1 | * | 5/2002 | Green et al. | ............... 455/3.02 |
| 6,556,807 | B1 | * | 4/2003 | Horie et al. | ............... 455/3.02 |
| 6,600,730 | B1 | * | 7/2003 | Davis et al. | ............... 370/343 |
| 6,600,897 | B1 | * | 7/2003 | Watanabe et al. | .......... 455/3.02 |

FOREIGN PATENT DOCUMENTS

| EP | 0 521 732 | 1/1993 | |
| EP | 521732 A2 | * 1/1993 | .......... H04H/01/00 |
| EP | 0 851 574 | 7/1998 | |

* cited by examiner

Primary Examiner—Pablo N. Tran
(74) Attorney, Agent, or Firm—Nixon & Vanderhye P.C.

(57) ABSTRACT

In a signal processing circuit of an LNB (Low Noise Block down converter), a power supply circuit is driven by DC voltage applied from four tuners via four signal input/output terminals to generate supply voltage for the LNB and equally distribute consumption current of the LNB among the four signal input/output terminals. Even if the level of the DC voltage from the four tuners is changed, currents of the same value flow through the four signal input/output terminals. Therefore, there is less noise compared with the conventional circuit having a signal input/output terminal allowing current to flow that varies.

4 Claims, 7 Drawing Sheets

RECEIVING APPARATUS SHARED BY MULTIPLE TUNERS

BACKGROUND OF THE INVENTION

1. Field of the Invention

The present invention relates to receiving apparatuses and particularly to a receiving apparatus shared by a plurality of tuners.

2. Description of the Background Art

FIG. 5 is a block diagram showing a structure of a receiving unit of a conventional satellite broadcasting system. Referring to FIG. 5, the receiving unit of the satellite broadcasting system includes an antenna 30 having a reflector 31 and an LNB (Low Noise Block down converter) 32, a receiver 33 having a DBS (Direct Broadcasting by Satellite) tuner 34, an FM demodulator 35, a video+audio circuit 36 and an amplifier 37, and a television receiver 38.

Radio waves α emitted from a satellite are supplied via reflector 31 to LNB 32. LNB 32 extracts from the received radio waves a image signals of a plurality of channels, amplifies the signals with noise kept low, and supplies an image signal of a channel selected by DBS tuner 34 to DBS tuner 34. An output signal of LNB 32 is supplied via DBS tuner 34 to FM demodulator 35 which FM-demodulates the output signal.

The FM-demodulated image signal is converted to a video signal and an audio signal by video+audio circuit 36, amplified by amplifier 37 and then supplied to television receiver 38. An image of the channel selected by DBS tuner 34 is displayed on the screen of television receiver 38.

FIG. 6 is a perspective view showing from the outside a structure of LNB 32. Referring to FIG. 6, LNB 32 has a casing member 41, and a feed phone 42 and a signal input/output terminal 43 are provided on the surface of casing member 41. Radio waves α reflected from reflector 31 of antenna 30 are supplied into an opening 42a of feed phone 42. In casing 41, a signal processing circuit is provided for processing the radio waves α supplied to feed phone 42. Signal input/output terminal 43 is connected to DBS tuner 34 via a cable.

FIG. 7 is a circuit block diagram showing a structure of the signal processing circuit of LNB 32. Referring to FIG. 7, the signal processing circuit includes LNAs (Low Noise Amplifiers) 44a and 44b, bandpass filters (BPFs) 45a–45d, local oscillators 46a and 46b, mixers 47a–47d, a selector 48, an IF amplifier 49, a low-pass filter (LPF) 50 and a regulator 51.

A horizontally polarized wave signal $\phi h$ and a vertically polarized wave signal $\phi v$ received by feed phone 42 are respectively amplified by LNAs 44a and 44b with noise kept low. An output signal of LNA 44a is supplied to bandpass filters 45a and 45c and an output signal of LNA 44b is supplied to bandpass filters 45b and 45d.

Signals $\phi h$ and $\phi v$ have a frequency band of 10.7–12.75 GHz. Bandpass filters 45a and 45b pass only the frequency components in the range of 10.7 to 11.7 GHz of respective signals $\phi h$ and $\phi v$. Bandpass filters 45c and 45d pass only the frequency components in the range of 11.7 to 12.75 GHz of respective signals $\phi h$ and $\phi v$. Respective signals $\phi h1$, $\phi v1$, $\phi h2$ and $\phi v2$ passed through bandpass filters 45a–45d are supplied respectively to mixers 47a–47d.

Local oscillator 46a generates a high-frequency signal of 9.75 GHz and supplies it to mixers 47a and 47b. Local oscillator 46b generates a high-frequency signal of 10.6 GHz and supplies it to mixers 47c and 47d. Signals $\phi h1$ and $\phi v1$ are converted respectively by mixers 47a and 47b into respective IF signals $\phi 1$ and $\phi 2$ of 950–1950 MHz. Signals $\phi h2$ and $\phi v2$ are converted respectively by mixers 47c and 47d into respective IF signals $\phi 3$ and $\phi 4$ of 1000–2150 MHz.

Selector 48 selects any of four IF signals $\phi 1$–$\phi 4$ according to a DC voltage V1 and a clock signal CLK supplied from DBS tuner 34 via input/output terminal 43 and low-pass filter 50 and supplies the selected IF signal to DBS tuner 34 via IF amplifier 49 and input/output terminal 43. The DC voltage V1 is 18 V or 13 V. The clock signal CLK has a frequency of 22 KHz and an amplitude of 0.6 V. Low-pass filter 50 allows DC voltage V1 and clock signal CLK to pass while it does not pass IF signals $\phi 1$–$\phi 4$.

If DC voltage V is 18 V, signals $\phi 1$ and $\phi 3$ are selected. If DC voltage V1 is 13 V, signals $\phi 2$ and $\phi 4$ are selected. If no clock signal CLK is input, signals $\phi 1$ and $\phi 2$ are selected and signals $\phi 3$ and $\phi 4$ are selected if clock signal CLK is input. Accordingly, signal $\phi 1$ is selected if DC voltage V1 is 18 V and no clock signal CLK is input, signal $\phi 2$ is selected if DC voltage V1 is 13 V and no clock signal CLK is input, signal $\phi 3$ is selected if DC voltage V1 is 18 V and clock signal CLK is input, and signal $\phi 4$ is selected if DC voltage V1 is 13 V and clock signal CLK is input.

DC voltage V1 is also used as the supply voltage of regulator 51. Regulator 51 uses DC voltage V1 as the supply voltage to generate a DC constant voltage V2 of 9 V and a DC constant voltage V3 of 5 V. DC constant voltage V2 of 9 V generated by regulator 51 is applied to IF amplifier 49 as its supply voltage, and DC constant voltage V3 of 5 V generated by regulator 51 is applied to LNAs 44a and 44b and local oscillators 46a and 46b as their supply voltage.

In recent years, there arises a need to share one LNB by a plurality of DBS tuners 34. For example, referring to FIG. 8, an LNB 55 shared by two DBS tuners 34 is provided with one feed phone 57 and two signal input/output terminals 58a and 58b on a casing member 56.

Regarding such an LNB 55, there is a problem that how supply voltages V2 and V3 for the LNA, local oscillator and IF amplifier should be generated. For example, according to the following description in conjunction with FIG. 9, two signal input/output terminals 58a and 58b are connected to a power supply node 61a of a regulator 61 via respective low-pass filters 59a and 59b and respective diodes 60a and 60b. Diodes 60a and 60b are provided for preventing, when one of the two signal input/output terminals 58a and 58b is supplied with 18 V and the other thereof is supplied with 13 V, current flow from one signal input/output terminal to the other signal input/output terminal to cause malfunction or breakdown of DBS tuners 34.

In this case, supposing that consumption current of LNB 55 is 200 mA, if DC voltages applied respectively to two signal input/output terminals 58a and 58b are the same (18 V or 13 V), currents of the same value (100 mA) flow through respective two signal input/output terminals 58a and 58b. However, if 18 V and 13 V are supplied respectively to signal input/output terminals 58a and 58b, current of 200 mA flows through signal input/output terminal 58a and no current flows through signal input/output terminal 58b. On the contrary, if signal input/output terminals 58a and 58b are supplied with 13 V and 18 V respectively, current of 200 mA flows through signal input/output terminal 58b and no current flows through signal input/output terminal 58a. For this reason, each time a channel is switched, current flowing from two DBS tuners 34 to LNB 55 greatly varies, generating noise. This noise causes a selector to malfunction, resulting in selection of a channel different from a desired channel or disorder of an image on a television receiver 38.

SUMMARY OF THE INVENTION

One object of the present invention is accordingly to provide a receiving apparatus which can be shared by a plurality of tuners while noise is reduced.

According to the present invention, a receiving apparatus includes a plurality of signal input/output terminals connected respectively to a plurality of tuners, an extraction/amplification circuit extracting/amplifying a plurality of image signals from received radio waves, a switch circuit provided correspondingly to each signal input/output terminal to select one image signal according to a level of DC voltage supplied from a corresponding tuner and supplying the selected image signal to the tuner, and a power supply circuit driven by DC voltage supplied from each signal input/output terminal to generate supply voltage for the extraction/amplification circuit and equally distribute consumption current of the extraction/amplification circuit among the signal input/output terminals. Therefore, even if DC voltages applied respectively to the signal input/output terminals have respective levels different from each other, or even if the level of the DC voltage for each signal input/output terminal is changed, a constant current flows through each signal input/output terminal. Consequently, there is less noise compared with the conventional receiving apparatus where the current flowing through each signal input/output terminal considerably varies.

Preferably, the power supply circuit includes a first voltage generating circuit provided correspondingly to each signal input/output terminal and driven by DC voltage applied via the corresponding signal input/output terminal to generate a first DC voltage, a second voltage generating circuit driven by DC voltage applied via at least one signal input/output terminal to generate a second DC voltage, and a transistor provided correspondingly to each first voltage generating circuit and having a first electrode receiving the first DC voltage generated by the corresponding first voltage generating circuit and an input electrode receiving the second DC voltage generated by the second voltage generating circuit for providing supply current from its second electrode to the extraction/amplification circuit. In this way, currents of the same value flow through respective transistors, and the sum of the currents of the transistors correspond to consumption current of the extraction/amplification circuit.

Still preferably, the power supply circuit further includes a plurality of diode elements connected respectively between the signal input/output terminals and a power supply node of the second voltage generating circuit. In this way, from any signal input/output terminal supplied with the highest DC voltage, the second voltage generating circuit receives DC voltage via a corresponding diode element.

Still preferably, the receiving apparatus further includes an amplification circuit provided correspondingly to each signal input/output terminal and driven by the first DC voltage generated by its corresponding first voltage generating circuit to amplify the image signal from its corresponding switch circuit and transmit the amplified image signal to the corresponding signal input/output terminal. In this way, the image signal can be amplified sufficiently. Further, as no supply voltage is applied to any amplification circuit not in use, reduction of power consumption is possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
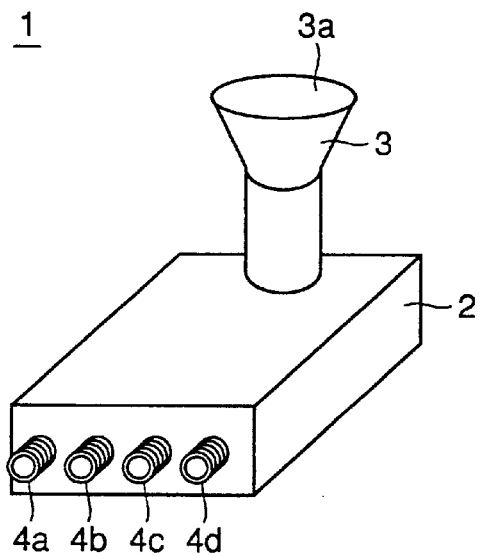
FIG. 1 is a perspective view showing from the outside a structure of an LNB according to one embodiment of the present invention.
Figure 6:
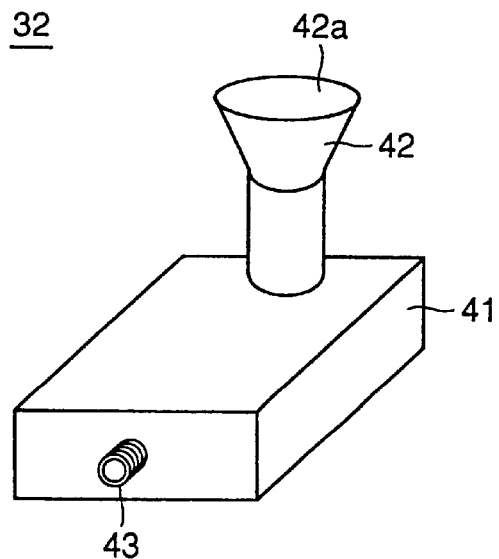
FIG. 6 is a perspective view showing from the outside a structure of an LNB in FIG. 5.

FIG. 1 is a perspective view showing a structure of an LNB 1 from the outside according to one embodiment of the present invention. Referring to FIG. 1, LNB 1 includes a casing member 2, a feed phone 3 provided on the surface thereof, and four signal input/output terminals 4a–4d. Radio waves α reflected from a reflector 31 of an antenna 30 are supplied to an opening 3a of feed phone 3. Within casing member 2, a signal processing circuit for processing the radio waves α supplied to feed phone 3 is housed. LNB 1 is shared by four DBS tuners 34. Four signal input/output terminals 4a–4d are connected respectively to DBS tuners 34 via cables.

Figure 2:
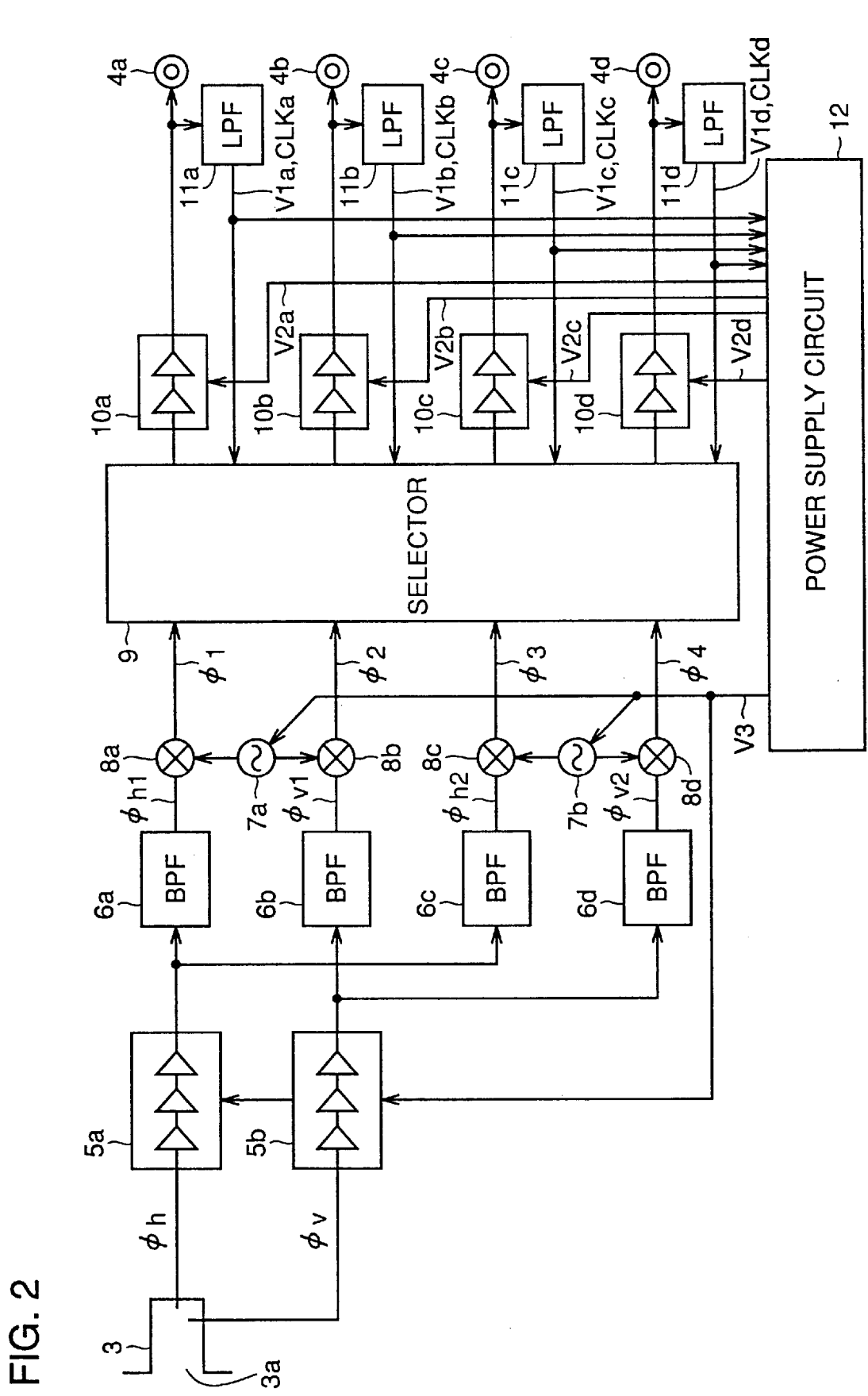
FIG. 2 is a circuit block diagram showing a structure of a signal processing circuit included in the LNB shown in FIG. 1.

FIG. 2 is a circuit block diagram showing a structure of the signal processing circuit of LNB 1. Referring to FIG. 2, the signal processing circuit includes LNAs 5a and 5b, bandpass filters 6a–6d, local oscillators 7a and 7b, mixers 8a–8d, a selector 9, IF amplifiers 10a–10d, low-pass filters 11a–11d, and a power supply circuit 12.

A horizontally polarized wave signal φh and a vertically polarized wave signal φv received by feed phone 3 are converted into IF signals φ1–φ4 similarly to those converted in the conventional LNB 32. Specifically, signal φh is amplified by LNA 5a and supplied to bandpass filters 6a and 6c. Signal φv is amplified by LNA 5b and supplied to bandpass filters 6b and 6d. Signals φh1, φv1, φh2 and φv2 passing through respective bandpass filters 6a–6d are supplied to respective mixers 8a–8d. A high-frequency signal generated by local oscillator 7a is supplied to mixers 8a and 8b and a high-frequency signal generated by local oscillator 7b is supplied to mixers 8c and 8d. Signals φh1, φv1, φh2 and φv2 are converted respectively by mixers 8a–8d into respective IF signals φ1–φ4.

Figure 3:
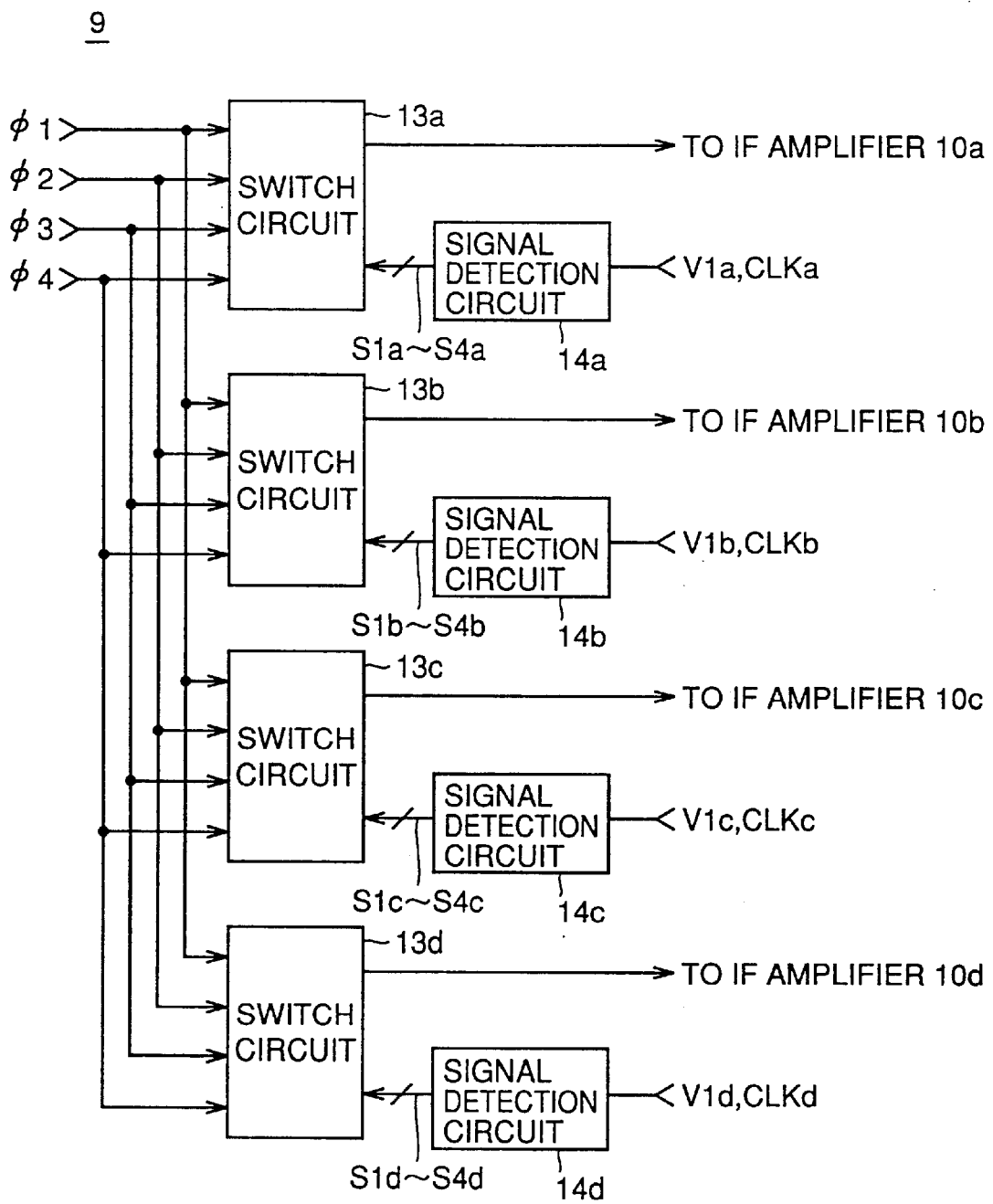
FIG. 3 is a block diagram showing a structure of a selector in FIG. 2.

Referring to FIG. 3, selector 9 includes four sets of switch circuits 13a–13d and signal detection circuits 14a–14d. Signal detection circuits 14a–14d set any of four signals S1a–S4a, . . . , S1d–S4d at "H" (logical high) level of the activation level, according to DC voltages V1a–V1d and clock signals CLKa-CLKd supplied from four DBS tuners 34 via signal input/output terminals 4a–4d and low-pass filters 11a–11d respectively.

Switch circuits 13a–13d select any of IF signals φ1–φ4 according to output signals S1a–S4a, . . . , S1d–S4d of signal detection circuits 14a–14d and supply the selected IF signal to IF amplifiers 10a–10d.

Regarding switch circuit 13a and signal detection circuit 14a, if DC voltage V1a is 18 V and clock signal CLKa is not input, signal S1a is set at H level to select signal φ1. If DC voltage V1a is 13 V and clock signal CLKa is not input, signal S2a is set at H level to select signal φ2. If DC voltage V1a is 18 V and clock signal CLKa is input, signal S3a is set at H level to select signal φ3. If DC voltage V1a is 13 V and clock signal CLKa is input, signal S4a is set at H level to select signal φ4. Other switch circuits 13b–13d and signal detection circuits 14b–14d operate similarly to switch circuit 13a and signal detection circuit 14a.

IF amplifiers 10a–10d respectively amplify IF signals from respective switch circuits 13a–13d and supply them to signal input/output terminals 4a–4d. Low-pass filters 11a–11d respectively allow DC voltages V1a–V1d and clock signals CLKa-CLKd to pass while they do not pass IF signals. DC voltages V1a–V1d are also used as supply voltage for power supply circuit.

Figure 4:
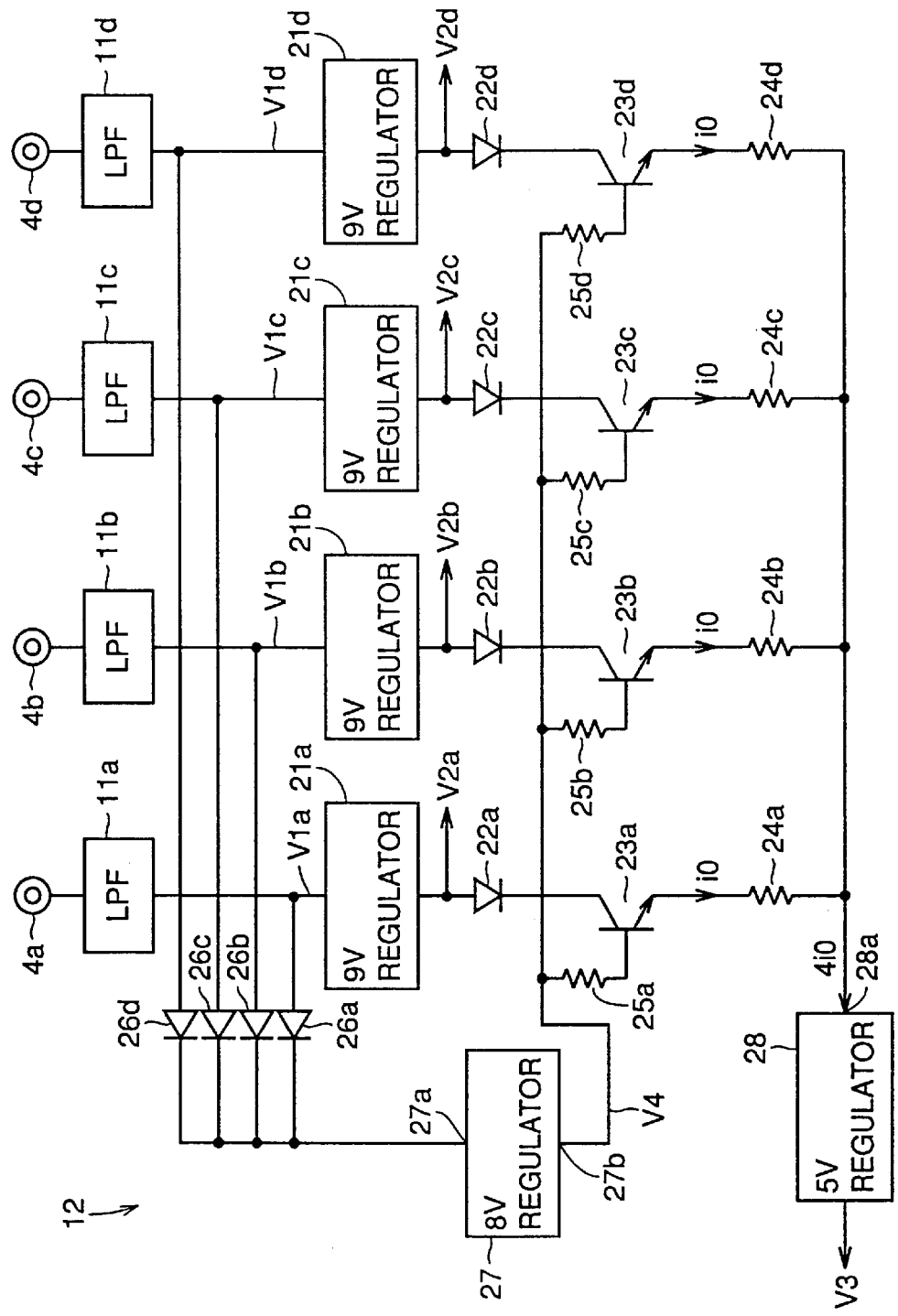
FIG. 4 is a circuit block diagram showing a structure of a power supply circuit in FIG. 2.
Figure 5:
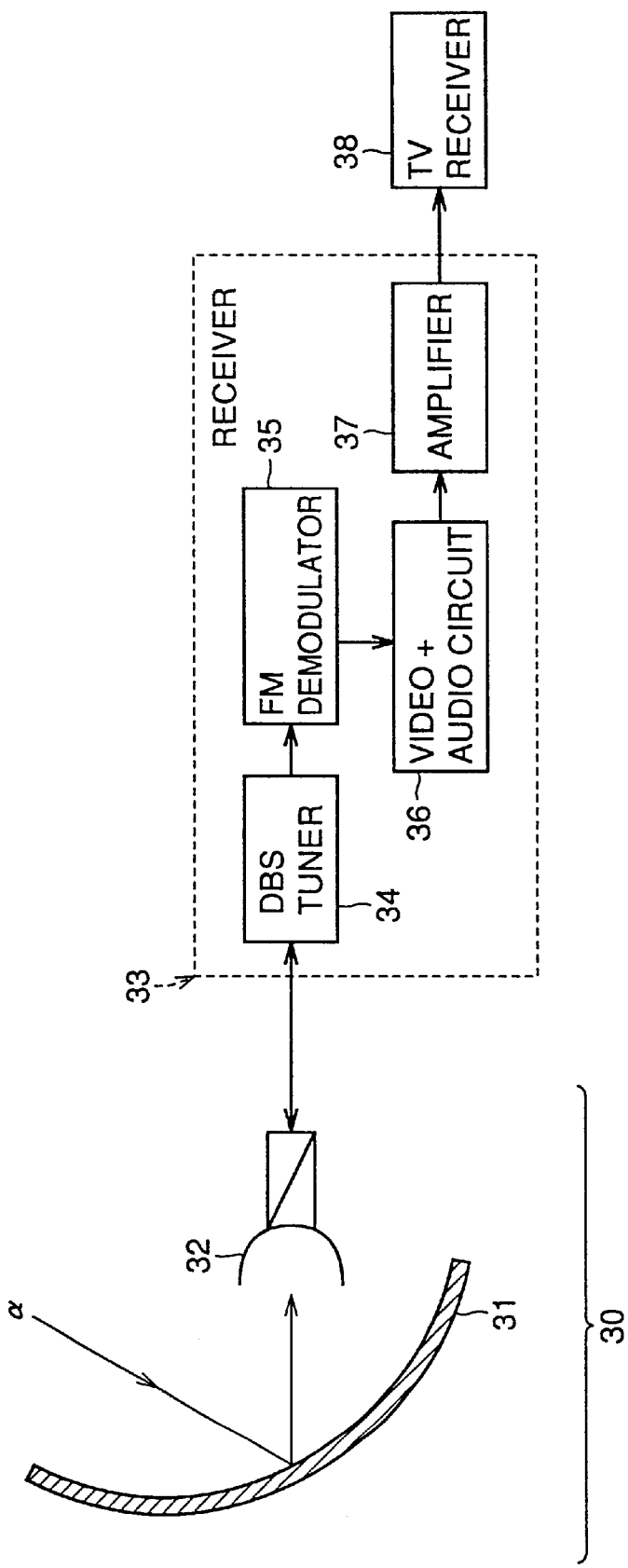
FIG. 5 is a block diagram showing a structure of a receiving unit for a conventional satellite broadcasting system.
Figure 7:
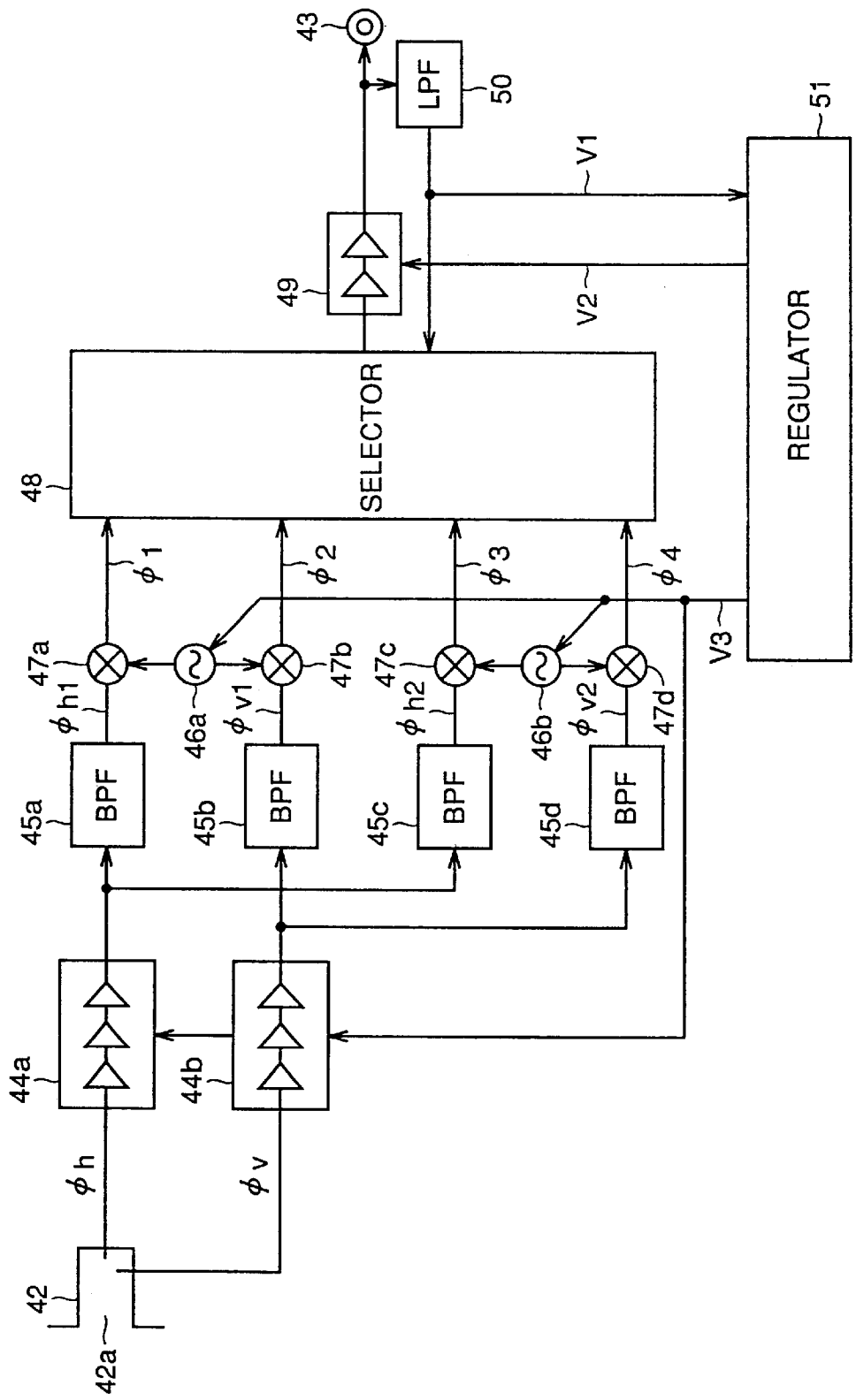
FIG. 7 is a circuit block diagram showing a structure of a signal processing circuit included in the LNB in FIG. 6.
Figure 8:
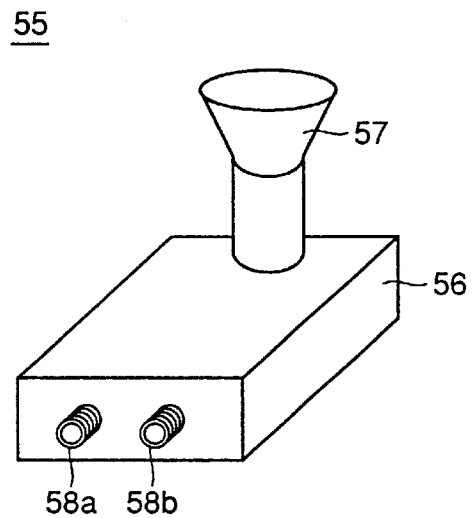
FIG. 8 is a perspective view showing from the outside a structure of an LNB shared by two tuners.
Figure 9:
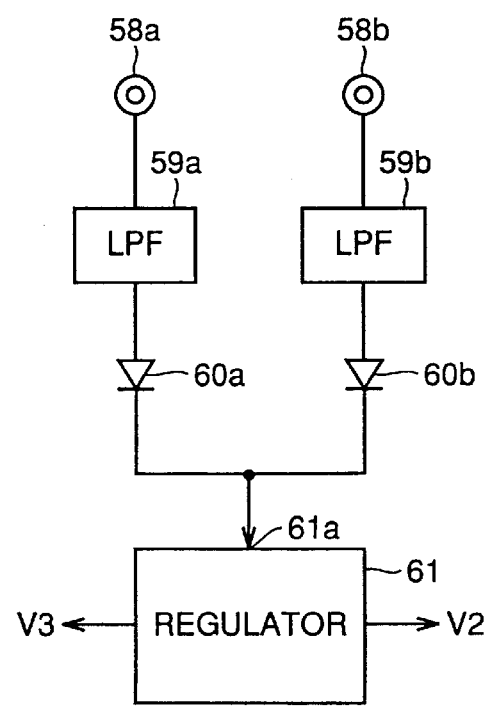
FIG. 9 is a circuit block diagram for illustration of a problem of the LNB in FIG. 8.

Referring to FIG. 4, power supply circuit 12 includes regulators 21a–21d, 27 and 28, diodes 22a14 22d and 26a–26d, NPN bipolar transistors 23a–23d, and resistor elements 24a–24d and 25a–25d.

Respective power supply nodes of regulators 21a–21d are connected to respective output nodes of low-pass filters 11a–11d. Regulators 21a–21d respectively generate DC constant voltages V2a–V2d of 9 V using as respective supply voltages the DC voltages V1a–V1d passed through low-pass filters 11a–11d. DC constant voltages V2a–V2d of 9 V are used as respective supply voltages for IF amplifiers 10a–10d.

Diodes 22a–22d are connected between respective output nodes of regulators 21a–21d and respective collectors of transistors 23a–23d. Resistor elements 24a–24d are connected between respective emitters of transistors 23a–23d and a power supply node 28a of regulator 28. Regulator 28 generates a DC constant voltage V3 of 5 V using voltage applied to power supply node 28a as its supply voltage. DC constant voltage V3 of 5 V is used as supply voltage for LNAs 5a and 5b and local oscillators 7a and 7b.

Diodes 26a–26d are connected between respective output nodes of low-pass filters 11a–11d and a power supply node 27a of regulator 27. Resistor elements 25a–25d are connected between an output node 27b of regulator 27 and respective bases of transistors 23a–23d. Regulator 27 generates a DC constant voltage V4 of 8 V using voltage applied to power supply node 27a as its supply voltage. DC constant voltage V4 of 8 V is uses as base voltage for transistors 23a–23d.

Suppose that 13 V is applied to signal input/output terminal 4a and 18 V is applied to signal input/output terminals 4b–4d. Regulators 21a–21d output constant voltages V2a–V2d of 9 V respectively. 18 V is applied to regulator 27 from signal input/output terminals 4b–4d via diodes 26b–26d and regulator 27 outputs DC constant voltage V4 of 8 V. Accordingly, consumption current of LNAs 5a and 5b and local oscillators 7a and 7b, i.e., consumption current 4i0 of regulator 28 is distributed among four transistors 23a–23d so that the same current i0 flows through each of the transistors 23a–23d. Consumption currents of regulators 21a–21d are respectively the sums of currents i0 flowing through respective transistors 23a–23d and currents flowing through respective IF amplifiers 10a–10d, therefore, respective consumption currents of regulators 21a–21d have almost the same current value. Since the base current of transistors 23a–23d is smaller enough than emitter current i0, current flowing through diodes 26b–26d is sufficiently smaller than current flowing through signal input/output terminals 4a–4d.

In this LNB 1, regardless of voltage (13 V, 18 V) applied to each of the four signal input/output terminals 4a–4d, currents of the same value flow through respective signal input/output terminals 4a–4d. Therefore, even if each of the four DBS tuners 34 connected to four input/output terminals 4a–4d switches its channel, there is no change in current flowing through signal input/output terminals 4a–4d and accordingly no noise is generated.

If only three signal input/output terminals 4a–4c among four signal input/output terminals 4a–4d are connected to tuners, consumption current of regulator 28 is equally distributed among three transistors 23a–23c and currents of the same value flow through three signal input/output terminals 4a–4c respectively. As no current flows through regulator 21d and transistor 23d, current is never consumed wastefully.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A receiving apparatus connected to a plurality of tuners to extract/amplify a plurality of image signals from received radio waves and supply an image signal of a channel selected by each tuner to the tuner, comprising:

a plurality of signal input/output terminals connected respectively to said plurality of tuners to transmit/receive signals;

an extraction/amplification circuit extracting/amplifying said plurality of image signals from said received radio waves;

a switch circuit provided correspondingly to each signal input/output terminal to select one of the image signals generated by said extraction/amplification circuit according to a level of DC voltage supplied from the tuner via the corresponding signal input/output terminal and supply the selected image signal to said tuner via the corresponding signal input/output terminal; and a power supply circuit driven by DC voltage supplied via each signal input/output terminal to generate supply voltage for said extraction/amplification circuit and equally distribute consumption current of said extraction/amplification circuit among said plurality of signal input/output terminals.

2. The receiving apparatus according to claim 1, wherein said power supply circuit includes:

a first voltage generating circuit provided correspondingly to each signal input/output terminal and driven by DC voltage applied via the corresponding signal input/output terminal to generate a predetermined first DC voltage;

a second voltage generating circuit driven by DC voltage applied via at least one signal input/output terminal among said plurality of signal input/output terminals to generate a predetermined second DC voltage; and a transistor provided correspondingly to each first voltage generating circuit and having a first electrode receiving the first DC voltage generated by the corresponding first voltage generating circuit and an input electrode receiving the second DC voltage generated by said second voltage generating circuit for providing supply current from its second electrode to said extraction/amplification circuit.

3. The receiving apparatus according to claim 2, wherein said power supply circuit further includes a plurality of diode elements connected respectively between said plurality of signal input/output terminals and a power supply node of said second voltage generating circuit.

4. The receiving apparatus according to claim 3, further comprising an amplification circuit provided correspondingly to each signal input/output terminal and driven by the first DC voltage generated by its corresponding first voltage generating circuit to amplify the image signal from its corresponding switch circuit and transmit the amplified image signal to the corresponding signal input/output terminal.

* * * * *